(12) United States Patent
Winer

(10) Patent No.: US 12,074,512 B2
(45) Date of Patent: Aug. 27, 2024

(54) AUTOMATIC POWER FACTOR CORRECTION

(71) Applicant: Hamilton Sundstrand Corporation, Charlotte, NC (US)

(72) Inventor: Gordon Elliott Winer, Prescott, AZ (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 226 days.

(21) Appl. No.: 17/534,765

(22) Filed: Nov. 24, 2021

(65) Prior Publication Data
US 2023/0163678 A1   May 25, 2023

(51) Int. Cl.
*H02M 1/42* (2007.01)
*H02M 7/04* (2006.01)
*H03K 3/037* (2006.01)
*H03K 5/24* (2006.01)

(52) U.S. Cl.
CPC ........... *H02M 1/4208* (2013.01); *H02M 7/04* (2013.01); *H03K 3/037* (2013.01); *H03K 5/24* (2013.01)

(58) Field of Classification Search
CPC .... H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291
See application file for complete search history.

(56) References Cited

U.S. PATENT DOCUMENTS

| | | | | |
|---|---|---|---|---|
| 5,798,635 | A | * | 8/1998 | Hwang ............... H02M 1/4225 323/222 |
| 5,804,951 | A | * | 9/1998 | Rivet .................. H02M 1/4208 363/125 |
| 5,963,021 | A | | 10/1999 | Rostron et al. |

(Continued)

FOREIGN PATENT DOCUMENTS

| JP | 926445 A | 1/1997 |
|---|---|---|
| JP | 1172517 A | 3/1999 |

OTHER PUBLICATIONS

Extended European Search Report for EP Application No. 22209403.9, dated Mar. 30, 2023, pp. 1-10.

(Continued)

*Primary Examiner* — Thienvu V Tran
*Assistant Examiner* — Nusrat Quddus
(74) *Attorney, Agent, or Firm* — CANTOR COLBURN LLP

(57) ABSTRACT

Systems for power factor correction are provided. Aspects include a voltage source connected to a first node, wherein the voltage source is configured to provide a first voltage, a sense resistor connected between the first node and a second node, a load connected to the second node, a power factor correction capacitor connected in parallel with the load, and a controlled voltage source configured to provide a second voltage to the power factor correction capacitor based on a control signal, wherein the control signal is received from a power factor correction circuit configured to determine a time difference between a zero-crossing of a voltage signal and a zero-crossing of a current signal from the voltage source.

14 Claims, 8 Drawing Sheets

(56) References Cited

U.S. PATENT DOCUMENTS

| | | | | |
|---|---|---|---|---|
| 5,994,869 | A * | 11/1999 | Becerra | H02P 6/085 |
| | | | | 318/729 |
| 6,366,474 | B1 | 4/2002 | Gucyski | |
| 8,384,361 | B2 | 2/2013 | Sirajuddin | |
| 8,736,237 | B2 * | 5/2014 | Orr | H02M 7/217 |
| | | | | 363/90 |
| 10,277,180 | B2 * | 4/2019 | Werking | H03F 3/45 |
| 10,333,416 | B2 * | 6/2019 | Kim | H02M 1/4225 |
| 10,630,168 | B1 * | 4/2020 | Wang | H02M 1/4208 |
| 10,700,542 | B2 | 6/2020 | Gerovac et al. | |
| 10,734,887 | B1 * | 8/2020 | Halberstadt | H02M 7/217 |
| 10,734,888 | B1 * | 8/2020 | Halberstadt | H02M 1/4225 |
| 2003/0035311 | A1 * | 2/2003 | Phadke | H02M 1/4225 |
| | | | | 363/89 |
| 2004/0095101 | A1 * | 5/2004 | Pidutti | H02M 1/4225 |
| | | | | 323/222 |
| 2004/0164718 | A1 * | 8/2004 | McDaniel | G05F 1/70 |
| | | | | 323/211 |
| 2005/0219871 | A1 * | 10/2005 | Li | H02M 1/4225 |
| | | | | 363/21.1 |
| 2011/0095731 | A1 * | 4/2011 | Zhao | H02M 1/4225 |
| | | | | 323/205 |
| 2013/0119949 | A1 * | 5/2013 | Albertson | G05F 1/70 |
| | | | | 361/434 |
| 2014/0125240 | A1 * | 5/2014 | Bordin | H05B 45/375 |
| | | | | 315/200 R |
| 2015/0180331 | A1 * | 6/2015 | Lin | H02M 1/4241 |
| | | | | 363/84 |
| 2015/0311865 | A1 * | 10/2015 | Lawson | H03F 3/217 |
| | | | | 330/251 |
| 2015/0365033 | A1 | 12/2015 | Salmon et al. | |
| 2020/0195131 | A1 * | 6/2020 | Masich | H03K 3/0377 |
| 2022/0271652 | A1 * | 8/2022 | Halberstadt | H03K 5/24 |
| 2022/0393574 | A1 * | 12/2022 | Pervaiz | H02M 3/33592 |
| 2023/0067735 | A1 * | 3/2023 | Chen | H02M 3/33523 |

OTHER PUBLICATIONS

Meng et al., "Research on the Intelligent Var Continuous Compensator Based on DSP", 2011 International Conference on Electronics and Optoelectronics, Jul. 29, 2011, pp. V2-317-V2-320.

* cited by examiner

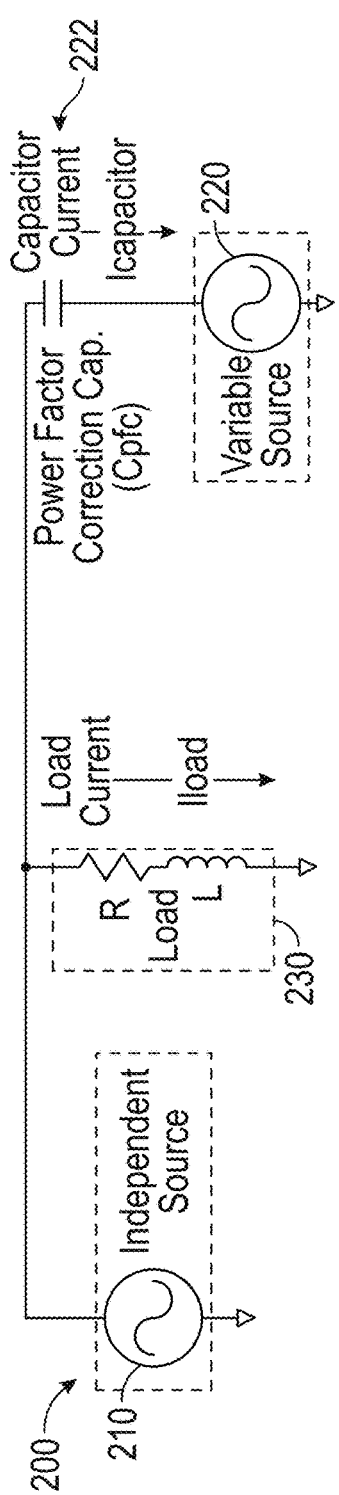

FIG. 2

When Capacitor Current = Imaginary Load Current, PF=1.0
Find the Value of Vvariable to Make Capacitor Current = Imaginary Load Current 1) Capacitor Current Magnitude  Icapacitor = $\dfrac{V_{independent} - V_{variable}}{X_C}$ Where $X_C = \dfrac{1}{2\pi f C}$
   and $X_C$ is Capacitive Reactance in Ohms, f is Frequency in Hertz, C is Capacitance in Farads, V Independent, V Variable are Voltages in V rms 2) Imaginary Load Current Magnitude  Imaginary Iload = $\left(\dfrac{V_{independent}}{\sqrt{R^2 + X_L^2}}\right)(SIN(ATAN(X_L/R)))$ Where $X_L = 2\pi f L$
   And $X_L$ is Inductive Reactance in Ohms, f is Frequency in Hertz, L is Inductance in Henrys, R is Resistance In Ohms 3) Set Icapacitor = Imaginary Iload   $\dfrac{V_{independent} - V_{variable}}{X_C} = \left(\dfrac{V_{independent}}{\sqrt{R^2 + X_L^2}}\right)(SIN(ATAN(X_L/R)))$ 4) Solve For Vvariable  Vvariable = $V_{independent} - \left(X_C\left(\dfrac{V_{independent}}{\sqrt{R^2 + X_L^2}}\right)(SIN(ATAN(X_L/R)))\right)$

AUTOMATIC POWER FACTOR CORRECTION

BACKGROUND

The present invention generally relates to power factor correction, and more specifically, to automatic power factor correction using a floating capacitor.

In electrical engineering, the power factor of an AC power system is defined as the ratio of the real power absorbed by the load to the apparent power flowing in the circuit, and is a dimensionless number in the closed interval of −1 to 1. A power factor magnitude of less than one indicates the voltage and current are not in phase, reducing the average product of the two. Real power is the instantaneous product of voltage and current and represents the capacity of the electricity for performing work. Apparent power is the product of RMS current and voltage. Due to energy stored in the load and returned to the source, or due to a non-linear load that distorts the wave shape of the current drawn from the source, the apparent power may be greater than the real power. A negative power factor occurs when the device (which is normally the load) generates power, which then flows back towards the source.

In an electric power system, a load with a low power factor draws more current than a load with a high power factor for the same amount of useful power transferred. The higher currents increase the energy lost in the distribution system, and require larger wires and other equipment. Because of the costs of larger equipment and wasted energy, electrical utilities will usually charge a higher cost to industrial or commercial customers where there is a low power factor. Power-factor correction increases the power factor of a load, improving efficiency for the distribution system to which it is attached. Linear loads with low power factor (such as induction motors) can be corrected with a passive network of capacitors or inductors. Non-linear loads, such as rectifiers, distort the current drawn from the system. In such cases, active or passive power factor correction may be used to counteract the distortion and raise the power factor.

BRIEF DESCRIPTION

Embodiments of the present invention are directed to a system. A non-limiting example of the system includes a voltage source connected to a first node, wherein the voltage source is configured to provide a first voltage, a sense resistor connected between the first node and a second node, a load connected to the second node, a power factor correction capacitor connected in parallel with the load, and a controlled voltage source configured to provide a second voltage to the power factor correction capacitor based on a control signal, wherein the control signal is received from a power factor correction circuit configured to determine a time difference between a zero-crossing of a voltage signal and a zero-crossing of a current signal from the voltage source.

In addition to one or more of the features described above, or as an alternative, further embodiments of the system may include that the power factor correction circuit includes a first comparator, wherein a positive input of the first comparator is connected to the first node, a difference amplifier, wherein a positive input of the difference amplifier is connected to the first node, and wherein a negative input of the difference amplifier is connected to the second node, and a second comparator, wherein a positive input of the second comparator is connected to an output of the difference amplifier.

In addition to one or more of the features described above, or as an alternative, further embodiments of the system may include that the power factor correction circuit further includes an SR latch, wherein the output of the first comparator is connected to a set input of the SR latch, and wherein the output of the second comparator is connected to a reset input of the SR latch.

In addition to one or more of the features described above, or as an alternative, further embodiments of the system may include that the power factor correction circuit further includes a first coupling capacitor between the output of the first comparator and the set input of the SR latch and a second coupling capacitor between the output of the second comparator and the reset input of the SR latch.

In addition to one or more of the features described above, or as an alternative, further embodiments of the system may include that the power factor correction circuit further includes a duty cycle to DC voltage converter configured to output a DC feedback signal, wherein a first input of the duty cycle to DC voltage converter is connected to an output of the first comparator, and wherein a second input of the duty cycle to DC voltage converter is connected to an output of the SR latch.

In addition to one or more of the features described above, or as an alternative, further embodiments of the system may include that the DC feedback signal comprises a bi-polar DC signal reflecting a time difference of a current zero crossing and a voltage zero crossing.

In addition to one or more of the features described above, or as an alternative, further embodiments of the system may include that the power factor correction circuit further includes a summing junction, wherein a first input of the summing junction is connected to a zero volt command signal, and wherein the second input of the summing junction is connected to the DC feedback signal.

In addition to one or more of the features described above, or as an alternative, further embodiments of the system may include that the controlled voltage source comprises a power amplifier and an analog multiplier, wherein a first input of the analog multiplier is connected to an output of the summing junction, and wherein a second input of the analog multiplier is connected to the first node.

In addition to one or more of the features described above, or as an alternative, further embodiments of the system may include that an output of the multiplier is connected to an input of the power amplifier.

In addition to one or more of the features described above, or as an alternative, further embodiments of the system may include that the power amplifier comprises a gain of one.

In addition to one or more of the features described above, or as an alternative, further embodiments of the system may include that an output of the power amplifier is connected to the power factor correction capacitor.

In addition to one or more of the features described above, or as an alternative, further embodiments of the system may include that the first voltage comprises a first frequency, wherein the second voltage comprises a second frequency, and wherein the first frequency is equal to the second frequency.

In addition to one or more of the features described above, or as an alternative, further embodiments of the system may include that responsive to a power factor less than one, the controlled voltage source provides the second voltage out of phase with the first voltage.

In addition to one or more of the features described above, or as an alternative, further embodiments of the system may include that the load comprises an AC load.

In addition to one or more of the features described above, or as an alternative, further embodiments of the system may include that the voltage source comprises an AC voltage source.

Embodiments of the present invention are directed to a system. A non-limiting example of the system includes a logic circuit configured to output a control signal based on a zero-crossing of a voltage signal and a zero-crossing of a current signal from an voltage source and load, a controlled voltage source configured to output a controlled voltage responsive to receiving the control signal, and a power factor correction capacitor connected to the controlled source.

In addition to one or more of the features described above, or as an alternative, further embodiments of the system may include that the control signal comprises a voltage value between −1 and 1.

In addition to one or more of the features described above, or as an alternative, further embodiments of the system may include that the controlled voltage source comprises a multiplier and a power amplifier.

In addition to one or more of the features described above, or as an alternative, further embodiments of the system may include that an output of the multiplier comprises the control signal multiplied with an output voltage of the voltage source.

In addition to one or more of the features described above, or as an alternative, further embodiments of the system may include that the power factor correction capacitor is in parallel with the load.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 depicts a circuit diagram and associated equations demonstrating power factor correction according to one or more embodiments;

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of aircraft electric power systems to implement the various technical features described herein are well known. Accordingly, in the interest of brevity, many conventional implementation details are only mentioned briefly herein or are omitted entirely without providing the well-known system and/or process details.

Figure 1:
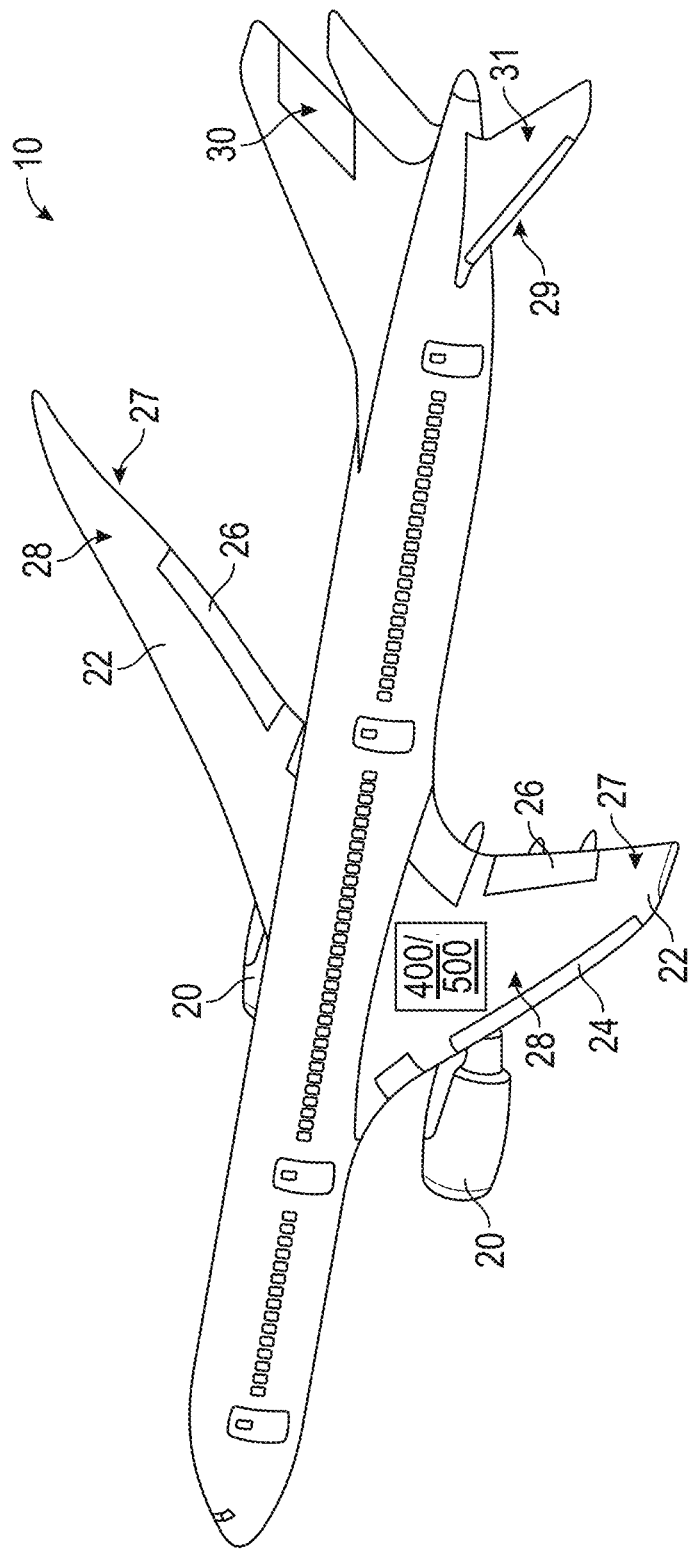
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes a power factor correction circuit 400/500 (described in greater detail in FIGS. 4 and 5) which allows for power factor correction of an AC source driving an AC load in the aircraft 10.

Turning now to an overview of technologies that are more specifically relevant to aspects of the disclosure, aspects of the present disclosure provide for a system and associated method for automatically correcting a power factor (PF) of an inductive load where the inductance can vary over a range of inductances. This is achieved through automatically adjusting a voltage across a power factor correction capacitor (Cpfc) until the phase shift between the load current and the load voltage is driven to a small value using a closed-loop negative-feedback architecture.

Figure 3:
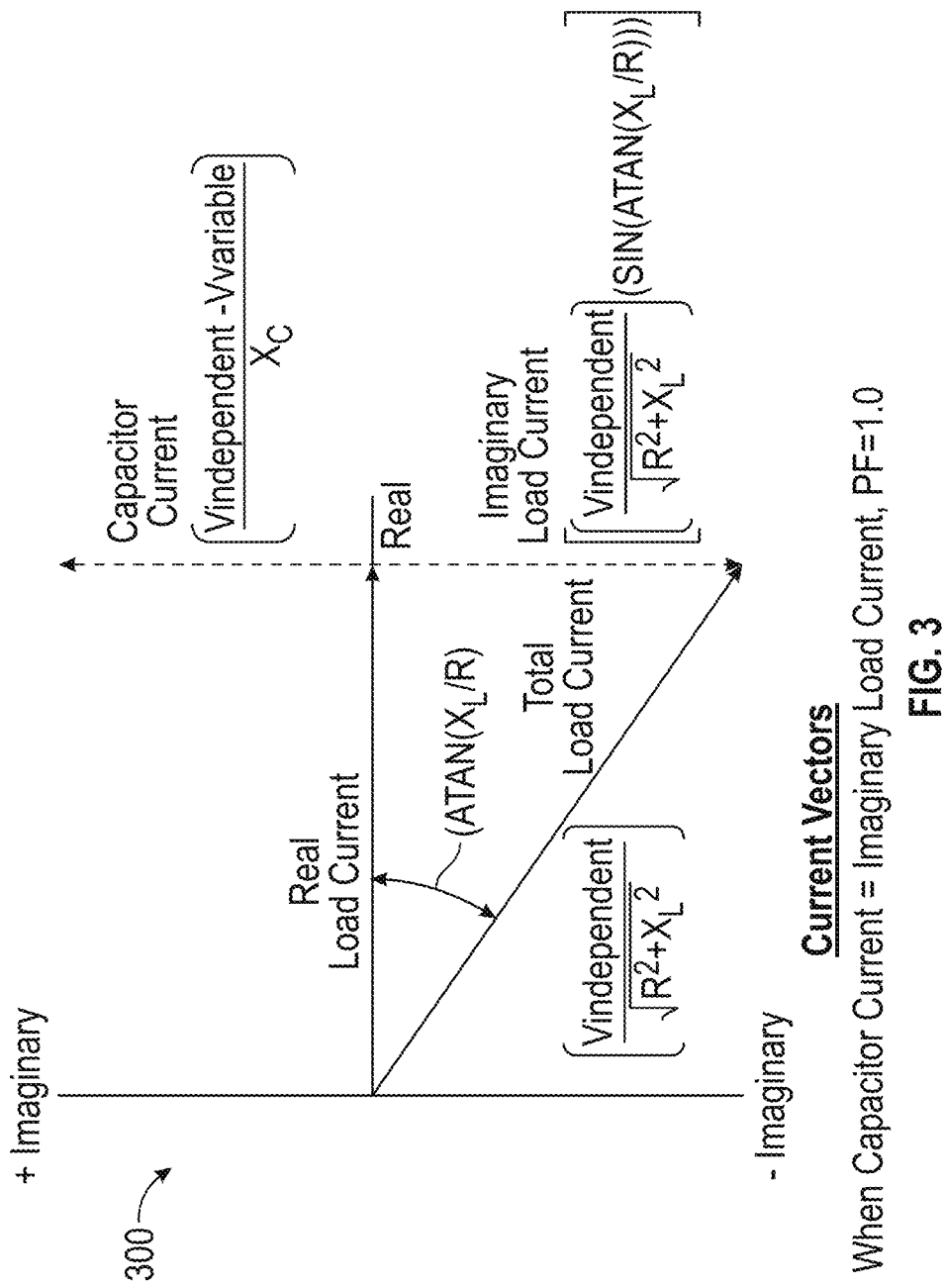
FIG. 3 depicts a vector diagram of the imaginary current in the load (Iload) according to one or more embodiments.

FIG. 2 depicts a circuit diagram and associated equations demonstrating power factor correction according to one or more embodiments. The circuit diagram 200 includes an independent source 210 driving a load 230. The circuit also includes a power factor correction capacitor 222 and variable source 220. To make the power factor (PF)=1, the variable source 220 is adjusted such that the capacitor current (Icapacitor) equals the imaginary current (Iload) in the load 230. This is demonstrated in the equations shown in FIG. 2. FIG. 3 depicts a vector diagram of the imaginary current in the load (Iload) according to one or more embodiments. Here, the vector diagram 300 includes demonstration of a PF=1. PF=1.0 when the capacitor current=Imaginary Load Current (not Total Load Current).

Figure 4:
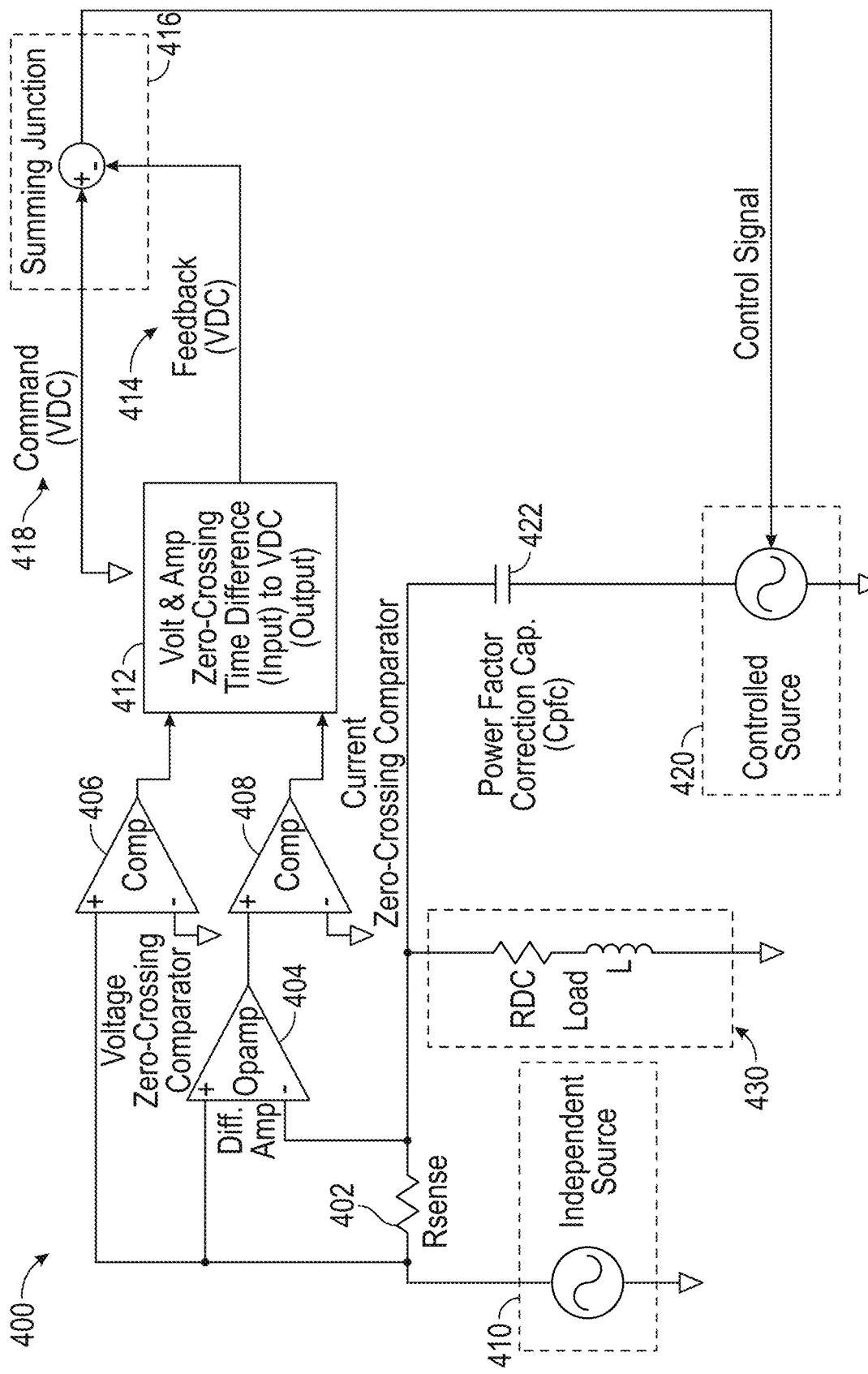
FIG. 4 depicts a block diagram of a power factor correction circuit with a power source and load according to one or more embodiments.

FIG. 4 depicts a block diagram of a power factor correction circuit with a power source and load according to one or more embodiments. The circuit 400 includes an independent power source 410 and a load 430. In one or more embodiments, the independent source 410 is an AC power source and can be an AC line from a mains or an AC line from a power system on an aircraft, for example. The load 430 can be an AC load having an inductance that can vary over a range. The circuit 400 includes a power factor correction circuit that utilizes a sense resistor 402 between a first node and a second node. The first node is connected to the output of the independent source 410 and the second node is connected to the load 430.

In one or more embodiments, the sense resistor 402 is utilized to determine the so-called zero crossings of the current waveform. Sense resistor 402 is used to provide current zero-crossing only in conjunction with Differential Amplifier 404 and Current Zero-Crossing Comparator 408. The zero crossing refers to when the waveform value crosses the zero threshold from positive to negative and vis-a-versa for the sinusoidal waveform for both the current and voltage values. A voltage zero-crossing comparator 406 is used for determining the voltage zero crossing. The comparator 406 is a two-input terminal analog device whose output is a logical high when the positive terminal input is greater or equal than the negative terminal. The positive terminal is connected at the first node and the negative terminal is connected to ground. The comparator 406 output is a logical low when the negative terminal input is greater than the positive terminal input. The circuit 400 also includes a difference amplifier (shown as a differential op-amp) 404 with a positive terminal input connected at the first node and a negative terminal input connected at the second node. The output of the difference amplifier 404 is connected to the positive input of the current zero-crossing comparator 408 while the negative input is connected to ground. The outputs of both the voltage zero-crossing comparator 406 and the current zero-crossing comparator 408 are connected to logic block 412 labeled as the voltage and amperage zero-crossing time difference to VDC output. Logic block 412 receives the inputs as the time difference between the zero-crossings of both the voltage and the current and outputs a feedback voltage value 414. The feedback voltage value 414 is inputted into a summing junction 416 at the negative input. The positive input of the summing junction 416 is connected to a command VDC 418 which is zero or ground. The output of the summing junction 416 is a command signal to a controlled source 420. The command signal is utilized to adjust the controlled source 420 based on the polarity and/or amplitude of the command signal. The controlled source 420 utilizes the same frequency AC power but can be in-phase or 180 degrees out of phase with the independent source 410. The controller source 420 is connected to a power factor correction capacitor 422. The series combination of power factor correction capacitor 422 and Controlled Source 420 is in parallel with the load 430. In one or more embodiments, the voltage across the power factor correction capacitor 422 is automatically adjusted by the controlled source 420 such that the capacitor current is equal to the imaginary current of the load 430 to achieve a power factor at or close to 1.

In one or more embodiments, the command VDC is equal to 0 (or ground) and is summed with the feedback VDC 414. The feedback VDC 414 is utilized to adjust the voltage behind the power factor correction capacitor 422. The control signal is a voltage based on the difference between the command VDC 418 and the feedback VDC 418. The control signal varies the amplitude and phase of the controlled source 420. The controlled source 420 and the independent source 410 are the same frequency and can be in-phase or out-of-phase by 180 degrees. If a large voltage is needed across the power factor correction capacitor 422, the controlled source 420 can be 180 degrees out of phase. If very little voltage across the power factor correction capacitor 422 is desired, the controlled source 420 would be in phase with the independent source 410. The control signal is either a positive or a negative value coming from the summing junction 416.

Figure 5:
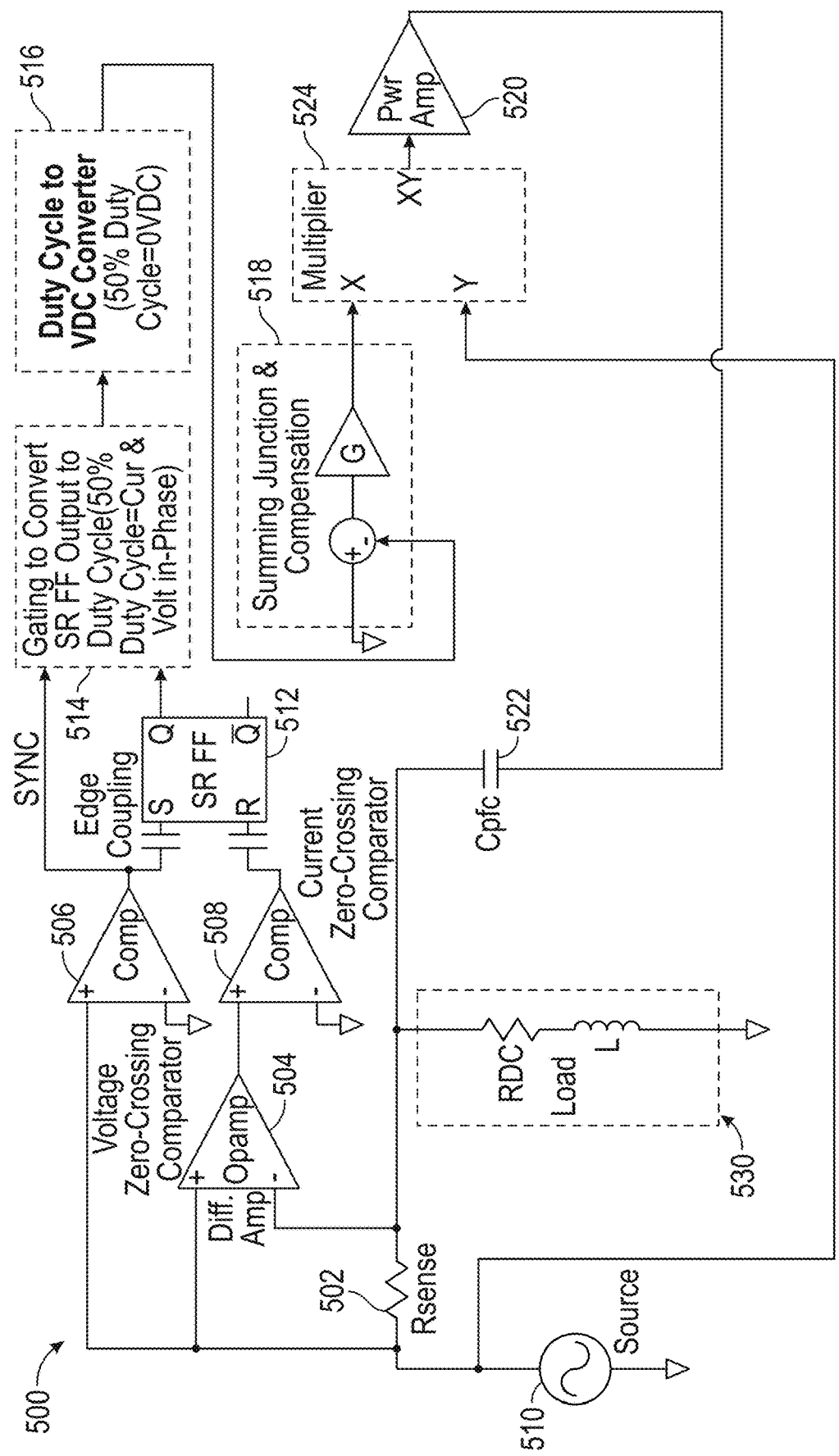
FIG. 5 depicts a power factor correction circuit according to one or more embodiments.

FIG. 5 depicts a power factor correction circuit according to one or more embodiments. The circuit 500 includes a source 510 and a load 530 connected to a power factor correction circuit. The source 510 can be an AC source and the load 530 can be an AC load. The circuit 500 includes a sense resistor 502 coupled between a first node connected to the source 510 and a second node connected to the load 530. A voltage zero-crossing comparator 506 receives the voltage signal from the first node at the positive terminal and the negative terminal is connected to ground. A difference amplifier 504 is connected to the first node (at the positive terminal) and the second node (at the negative terminal). The output of the difference amplifier 504 is connected to a positive terminal of a current zero-crossing comparator 508 while the negative terminal of the current zero-crossing comparator 508 is connected to ground.

In one or more embodiments, the output of the voltage zero-crossing comparator 506 is coupled through a coupling capacitor to the set (S) input of an SR latch 512 and the output of the current zero-crossing comparator 508 is coupled through a second coupling capacitor to the reset (R) input of the SR latch 512 (flip-flop). The output (Q) of the SR latch 512 and the output of the voltage zero-crossing comparator 506 are inputs to block 514. At block 514, a set of logic circuits convert the time difference between the zero crossings to a digital signal with a duty cycle reflective of the time difference. The digital duty cycle signal is output from logic block 514 and is used by the duty cycle to VDC converter logic block 516 to output a bi-polar DC signal that reflects the time difference of the current and voltage zero-crossings. The bi-polar DC signal is summed with a reference signal (0 VDC) at the summing junction and compensation circuit 518. The output of the summing junction and compensation circuit 518 is an amplified DC error signal. The compensation (gain) is used to optimize loop stability and frequency response. This amplified DC error signal is used to attenuate or magnify the AC voltage source 520 by the multiplier 524. The multiplier 524 can be an analog multiplier with a first input (X) as the DC error signal and a second input (Y) as the output of the source 510. The amplitude of the multiplied DC and AC signal is automatically adjusted such that the voltage across a power factor correction capacitor 522 forces the zero-crossing time difference to zero. That is to say, the capacitor current is equal to the imaginary current in the load inductor.

In one or more embodiments, the power factor correction occurs by applying a voltage across the power factor correction capacitor 522 to counteract the effect of any inductance coming from the load 530. In a scenario that requires a large voltage across the power factor correction capacitor 522, an output of the summing junction and compensation 518 would be a negative polarity so that the output of the multiplier 524 would be 180 degrees out of phase with the voltage of the source 510. The power amplifier 520 can have a gain of 1. When the output of the power amplifier 520 is out of phase of the voltage source 510, the voltage will be high when the source 510 voltage is low and vis-a-versa. This would be used when the absolute value of the power factor for the load is much less than 1, as would be the case with a highly inductive load. For all intents and purposes power factor can range from 0 to 1; a negative power factor would indicate an "overly-capacitive" situation where too much capacitance was added such that the vector of the reactive power with respect to real power is in the 4$^{th}$ quadrant (270 deg to 360 deg). When a low voltage across the power factor correction capacitor 522 is desired (e.g., absolute value of the load power factor at or close to 1) the output of the summing junction and compensation would be small giving the output of the multiplier 524 to be in phase with the source 510 voltage thus developing a small voltage across the capacitor which in turn produces a small amount of current through the capacitor.

Figure 6:
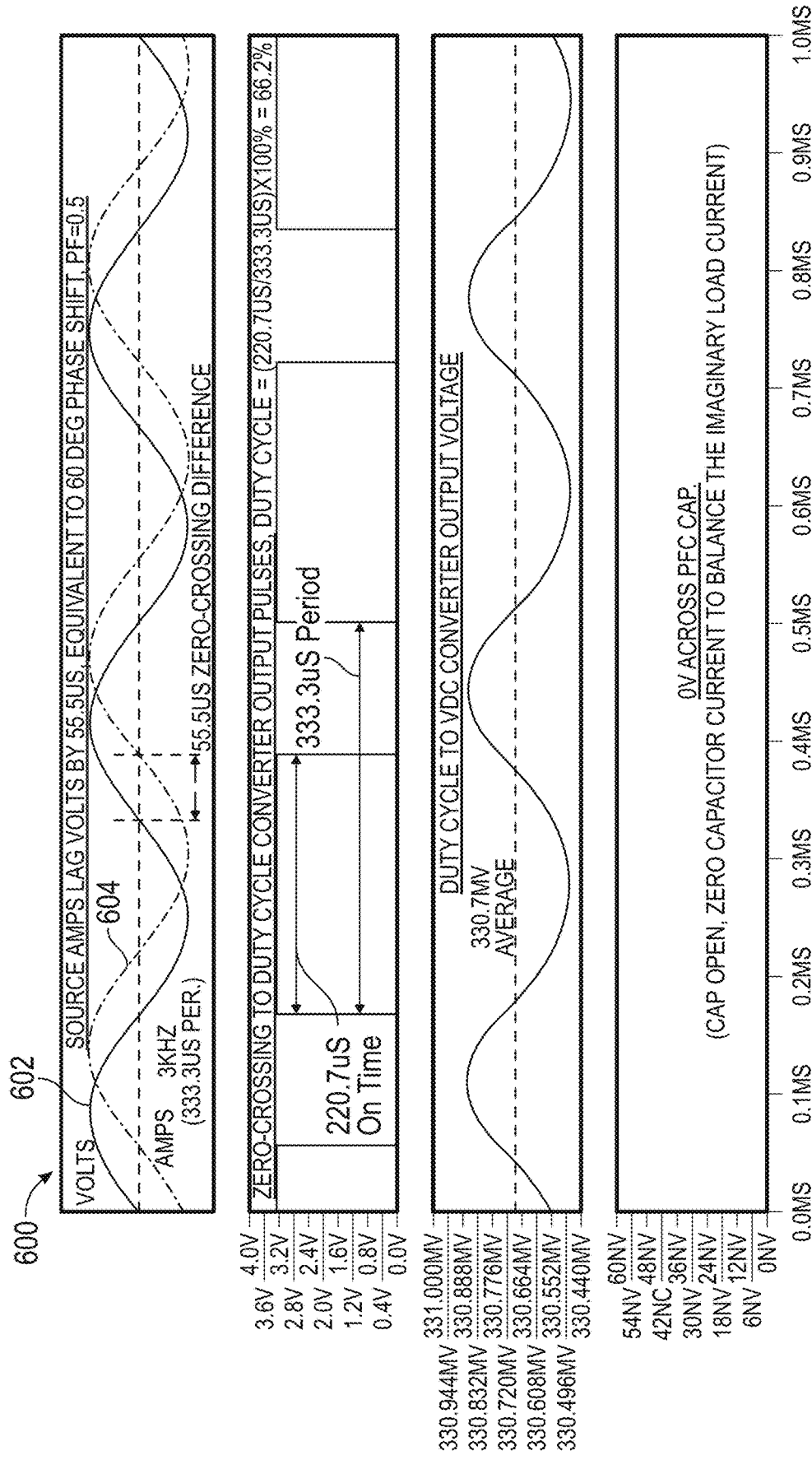
FIG. 6 depicts a timing chart showing a waveform for an uncompensated power factor condition according to one or more embodiments.
Figure 7:
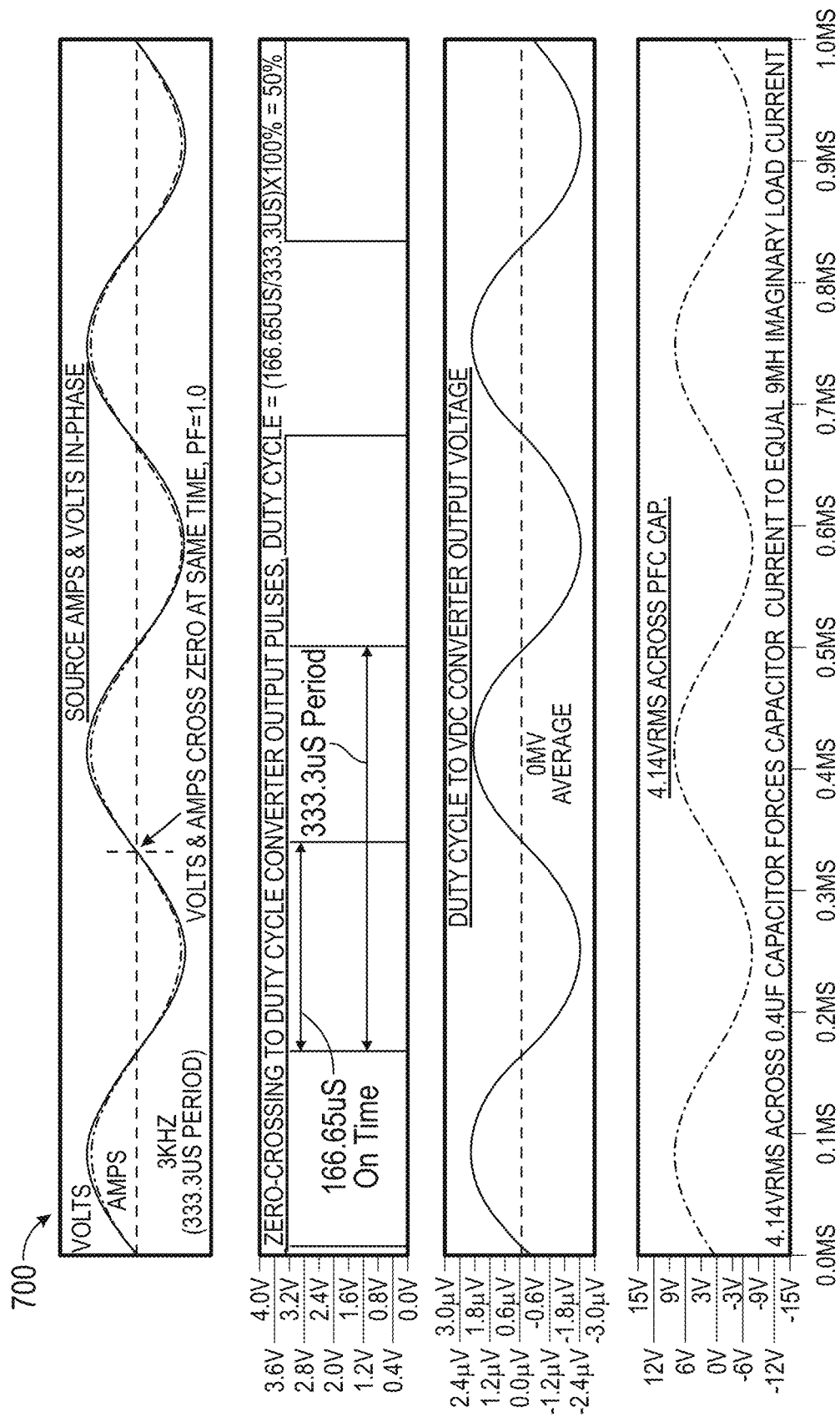
FIG. 7 depicts a timing chart showing a waveform for a compensated power factor condition according to one or more embodiments.

FIG. 6 depicts a timing chart showing a waveform for an uncompensated power factor condition according to one or more embodiments. The timing chart 600 includes the voltage waveform 602 and current waveform 604. In the example timing chart, the current waveform 604 lags the voltage waveform 602 by 60 degrees which equates to a zero crossing time difference of 55.5 uS which equates to a duty cycle of 66.2%. This would produce a non-zero voltage at the output of the duty cycle to DCV converter. But in this example, there is no power factor capacitor to show the circuit behavior without compensation. A current that is in phase with a voltage waveform produces a 50% duty cycle and when current is leading the voltage this would produce a duty cycle of less than 50%. This is converted in the logic block 316 for duty cycle to VDC converter that converts a duty cycle >50% to a positive voltage and converts a duty cycle <50% to a negative voltage. This correction is shown in the following figures FIG. 7 depicts a timing chart showing a waveform for a compensated power factor condition according to one or more embodiments. In the exemplary timing chart 700 the PFC cap connected, load is 93 ohm resistor in series with 9 mH inductor, and Vsource=7.07 Vrms, power factor automatically corrects to 1.0 by forcing 4.14 Vrms across the PFC cap. Looking at the average voltage of the Duty Cycle to VDC converter, it is at or close to zero which results to a power factor of close to 1.

Figure 8:
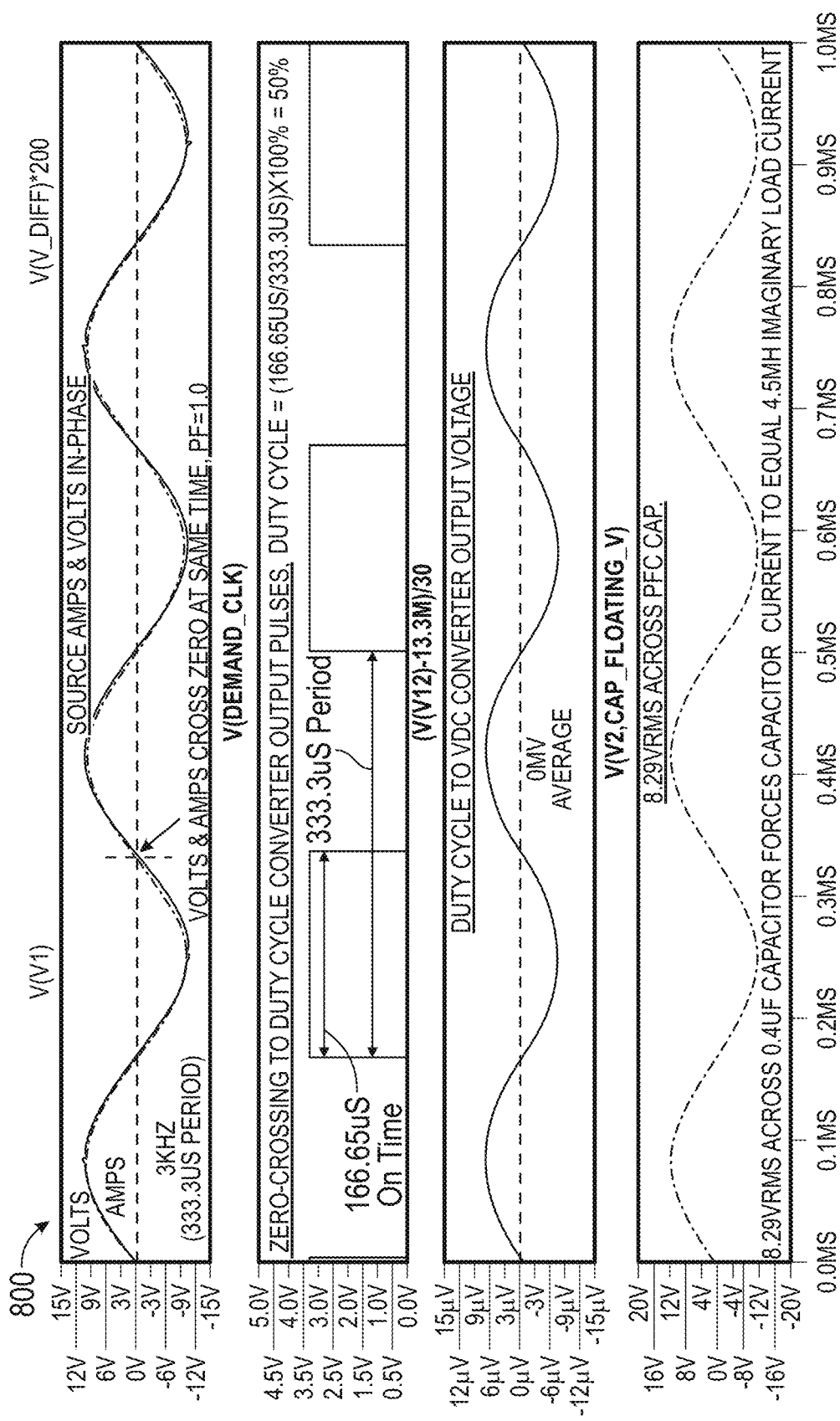
FIG. 8 depicts a timing showing a waveform for a compensated power factor condition according to one or more embodiments.

FIG. 8 depicts a timing showing a waveform for a compensated power factor condition according to one or more embodiments. In the exemplary timing chart 800, PFC cap connected, load is 49 ohm resistor in series with 4.5 mH inductor, and Vsource=7.07 Vrms, power factor automatically corrects to 1.0 by forcing 8.29 Vrms across the PFC cap. Note the voltage across the capacitor is doubled from the Vrms in FIG. 7 but the average voltage of the Duty Cycle to VDC converter is at or close to 0V.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
   a voltage source connected to a first node, wherein the voltage source is configured to provide a first voltage;
   a sense resistor connected between the first node and a second node;
   a load connected to the second node;
   a power factor correction capacitor in series connection with a controlled voltage source, the series connection of the power factor correction capacitor and the controlled voltage source being connected in parallel with the load; and
   the controlled voltage source configured to provide a second voltage to the power factor correction capacitor based on a control signal, wherein the control signal is received from a power factor correction circuit configured to determine a time difference between a zero-crossing of a voltage signal and a zero-crossing of a current signal from the voltage source, wherein the power factor correction circuit includes a first comparator, wherein a positive input of the first comparator is connected to the first node, a difference amplifier, wherein a positive input of the difference amplifier is connected to the first node, and wherein a negative input of the difference amplifier is connected to the second node, and a second comparator, wherein a positive input of the second comparator is connected to an output of the difference amplifier.

2. The system of claim 1, wherein the power factor correction circuit further comprises:
an SR latch, wherein the output of the first comparator is connected to a set input of the SR latch, and wherein the output of the second comparator is connected to a reset input of the SR latch.

3. The system of claim 2, wherein the power factor correction circuit further comprises:
a first coupling capacitor between the output of the first comparator and the set input of the SR latch; and
a second coupling capacitor between the output of the second comparator and the reset input of the SR latch.

4. The system of claim 2, wherein the power factor correction circuit further comprises:
a duty cycle to DC voltage converter configured to output a DC feedback signal, wherein a first input of the duty cycle to DC voltage converter is connected to an output of the first comparator, and wherein a second input of the duty cycle to DC voltage converter is connected to an output of the SR latch.

5. The system of claim 4, wherein the DC feedback signal comprises a bi-polar DC signal reflecting a time difference of a current zero crossing and a voltage zero crossing.

6. The system of claim 4, wherein the power factor correction circuit further comprises:
a summing junction, wherein a first input of the summing junction is connected to a zero volt command signal, and wherein the second input of the summing junction is connected to the DC feedback signal.

7. The system of claim 6, wherein the controlled voltage source comprises a power amplifier and an analog multiplier;
wherein a first input of the analog multiplier is connected to an output of the summing junction; and
wherein a second input of the analog multiplier is connected to the first node.

8. The system of claim 7, wherein an output of the multiplier is connected to an input of the power amplifier.

9. The system of claim 1, wherein the power amplifier comprises a gain of one.

10. The system of claim 1, wherein an output of the power amplifier is connected to the power factor correction capacitor.

11. The system of claim 1, wherein the first voltage comprises a first frequency;
wherein the second voltage comprises a second frequency; and
wherein the first frequency is equal to the second frequency.

12. The system of claim 1, wherein responsive to a power factor less than one, the controlled voltage source provides the second voltage out of phase with the first voltage.

13. The system of claim 1, wherein the load comprises an AC load.

14. The system of claim 1, wherein the voltage source comprises an AC voltage source.

* * * * *